United States Patent
Pasqualetto

(10) Patent No.: US 9,568,560 B2
(45) Date of Patent: Feb. 14, 2017

(54) DETECTION OF A SHORT-CIRCUIT IN A SWITCHING STRUCTURE

(71) Applicant: Angelo Pasqualetto, Toulouse (FR)

(72) Inventor: Angelo Pasqualetto, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 323 days.

(21) Appl. No.: 14/503,686

(22) Filed: Oct. 1, 2014

(65) Prior Publication Data

US 2015/0145553 A1 May 28, 2015

(30) Foreign Application Priority Data

Nov. 22, 2013 (FR) ...................... 13 61534

(51) Int. Cl.
*G01R 31/40* (2014.01)
*H03K 17/082* (2006.01)

(52) U.S. Cl.
CPC ........... *G01R 31/40* (2013.01); *H03K 17/0822* (2013.01); *H03K 2217/0027* (2013.01)

(58) Field of Classification Search
CPC .............. G01R 31/40; G01R 31/31721; G01R 31/2884; G01R 31/3004; G01R 31/31715; G01R 31/025; G01R 31/08; G01R 31/2805; G01R 31/024; G01R 31/3278; G01R 31/3275; G01R 31/343; G01R 27/02; G01R 27/16

USPC ................ 324/764.01, 750.3, 415–423, 522, 537,324/762.08, 762.09, 762.01, 750.01, 500,324/750.15, 555
See application file for complete search history.

(56) References Cited

U.S. PATENT DOCUMENTS

| | | | |
|---|---|---|---|
| 7,265,535 B2 | 9/2007 | Arndt et al. | |
| 8,704,540 B2* | 4/2014 | Hashimoto | ........ G01R 31/2621 324/750.01 |
| 2012/0043900 A1* | 2/2012 | Chitta | ................... H05B 41/295 315/201 |
| 2012/0249185 A1 | 10/2012 | Iriarte et al. | |
| 2014/0333320 A1* | 11/2014 | Barnetova | ............ G01R 31/025 324/503 |
| 2014/0361722 A1* | 12/2014 | Barth | ....................... H02P 8/02 318/490 |

OTHER PUBLICATIONS

FR Search Report, dated May 23, 2014, from corresponding FR application.

* cited by examiner

*Primary Examiner* — Son Le
*Assistant Examiner* — Thang Le
(74) *Attorney, Agent, or Firm* — Young & Thompson

(57) ABSTRACT

A device for supplying power to an inductive load includes a switching structure designed to control a current in the load, and elements for detecting anomalies designed to generate information on detection or information on non-detection of an anomaly of the short-circuit type able to occur in the cabling toward the load, in combination with information on validity of the information on non-detection of anomalies. The information on anomaly non-detection is delivered without setting the validity information if the measured current at the end of an appropriate time window is less than a given value of current.

13 Claims, 9 Drawing Sheets

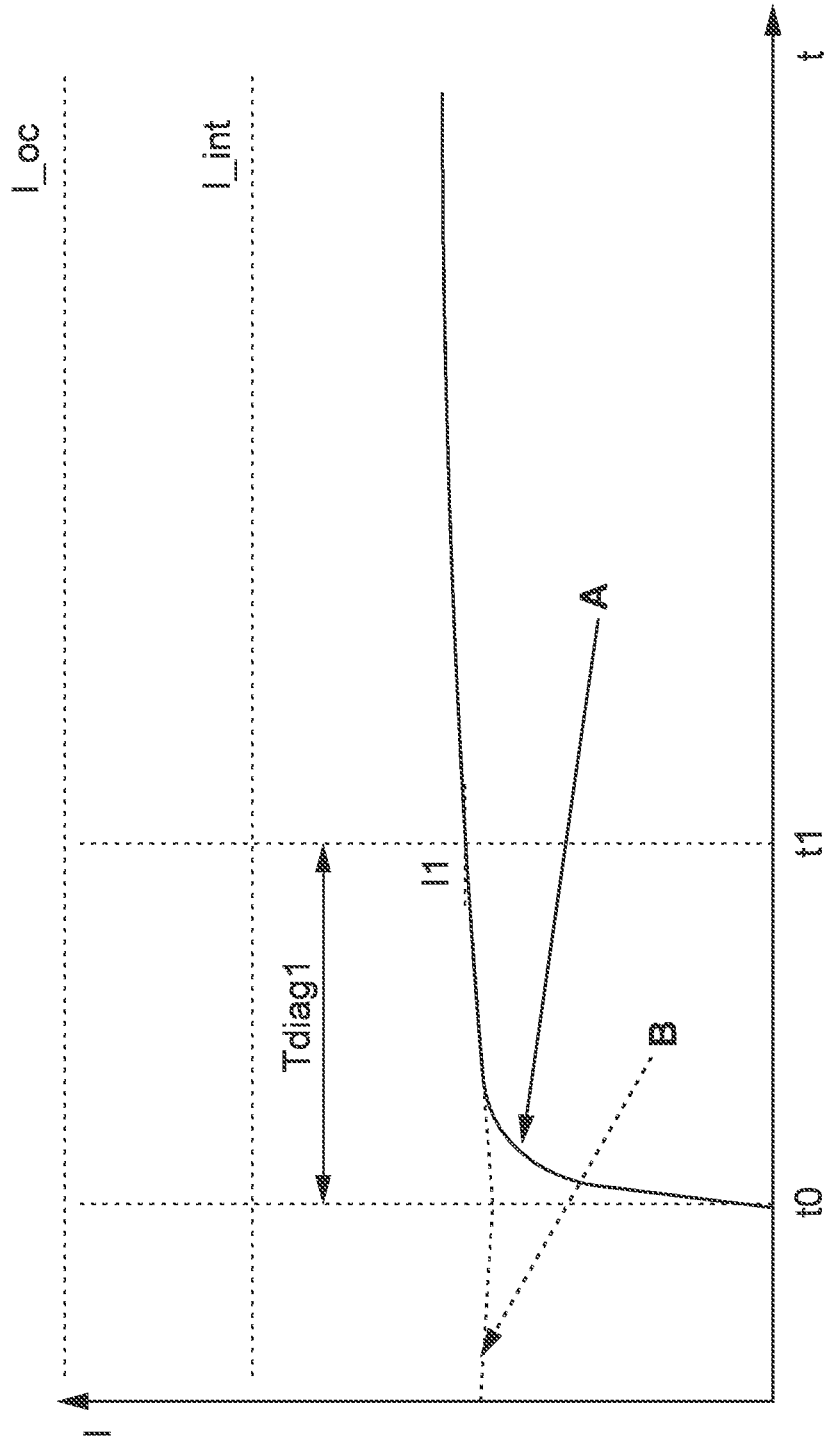

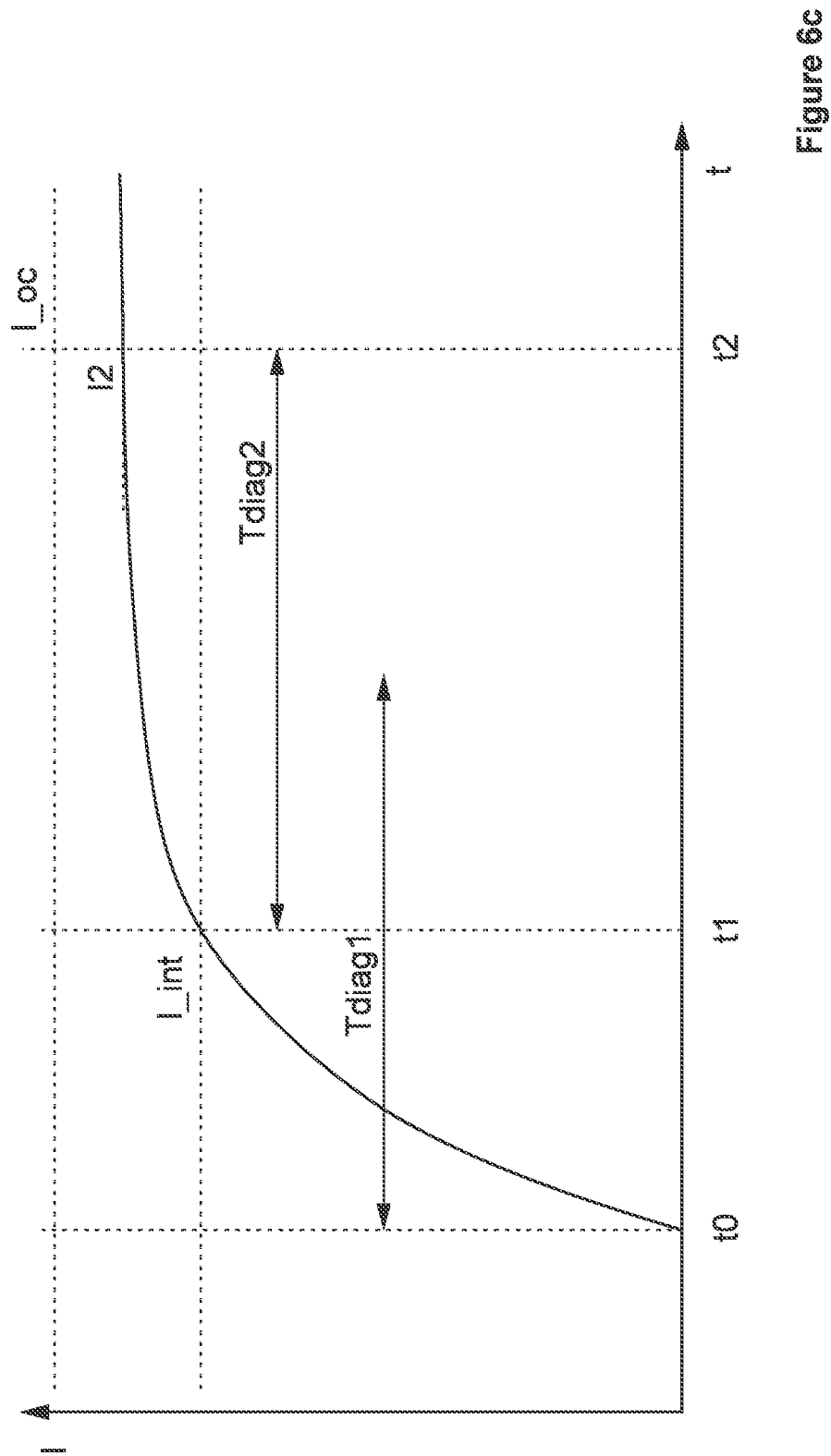

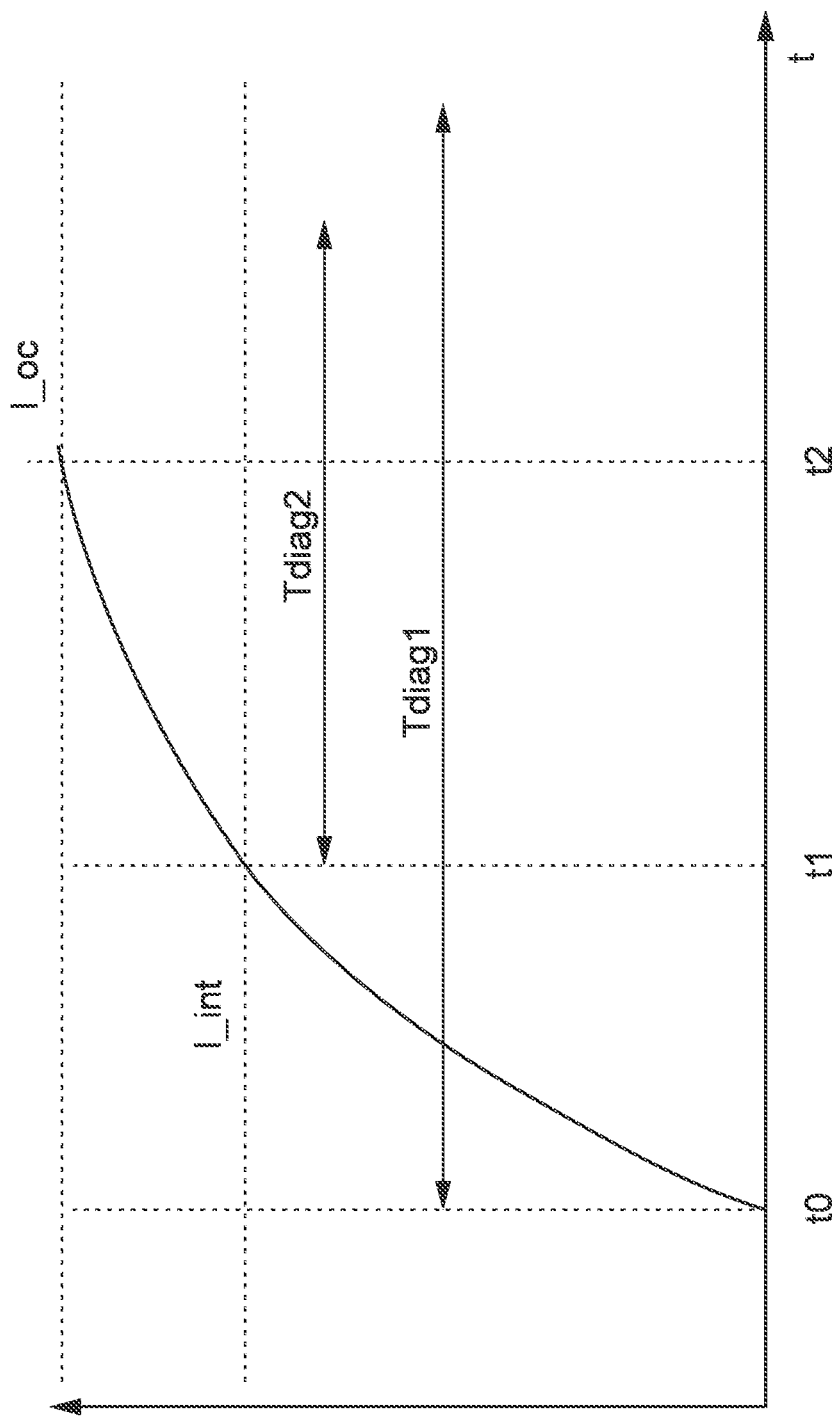

DETECTION OF A SHORT-CIRCUIT IN A SWITCHING STRUCTURE

FIELD OF THE INVENTION

The present invention relates, in a general way to the powering of inductive loads.

It relates, more especially, to the detection of anomalies, such as short-circuits, that can occur in a switching structure such as a transistor bridge, for example, which is designed for controlling a current of given value in an inductive load.

BACKGROUND OF THE INVENTION

The invention has applications, in particular, in the automobile field. It can be implemented, for example, in an electronic circuit incorporating a switching structure such as a transistor H-bridge.

In the automobile industry, such integrated circuits are used for controlling the direction and/or the intensity of the electrical current in inductive loads such as for example electric motors.

These motors may be used in electronic control systems for an actuator. This could for example be a device for controlling a throttle valve (or ETC device, for "Electronic Throttle Control"), or the exhaust gas recirculation valve (or EGR device), or any other valve used in the engine or other control. More generally, it could be any other equipment actuated by electric motor, such as an electric window, for example.

The power supply for such inductive loads generally uses a switching structure such as a switching H-bridge. An H-bridge comprises four power switches, namely two "high" switches on the side of a positive power supply, for example a battery producing a positive power supply voltage, and two "low" switches on the side of a negative power supply or ground. Each switch generally comprises a MOS (Metal Oxide Semiconductor) power transistor.

A sequence of analog control signals for the four transistors is produced based on a setpoint control signal. The setpoint signal and the analog control signals are in general pulse-width modulated signals, or PWM signals. Their duty cycle allows the quantity of current injected into the inductive load to be controlled and hence, on average, the intensity of the current in this load.

One example of a functional breakdown of an electronic control system according to a layered architecture is illustrated in FIG. 2. A layer 21, hierarchically the highest, named "application" layer, allows a set of parameters to be chosen (initialization). The setpoint signal is generated within a layer 22 referred to as "control" layer of the system, coming above a layer 23, or "command" layer, itself above a layer 24, or "hardware" layer, composed of the electronic elements of the H-bridge. With regard to the hardware and/or software implementation, the "command" layer 23 and "hardware" layer 24 can be formed within the same integrated circuit. The "application" layer 21 and "control" layer 22 can be implemented in the microprocessor of a automobile's computer.

One given strategy causes the control of the H-bridge in certain given configurations, at the frequency of the setpoint signal. Other configurations are on the contrary prohibited, such as for example a configuration where a high switch and a low switch are closed together creating a short-circuit between the battery and ground.

Short-circuits may occur within the cabling between the outputs of the H-bridge, or between each of the outputs and ground, or between each of the outputs and the positive voltage of the battery. The H-bridge protects itself by disconnecting itself from the power in a case of short-circuit, and thus avoids its own destruction.

The existence of a potential short-circuit can be verified by a measurement of the current flowing through the power transistors. This measurement must be carried out during one period of the control signals, inside of a time window entirely included within a fraction of said period of the control signals where the latter do not change electrical state, which clearly depends on the duty cycle. If the current measured during this reference time window exceeds a given threshold, called short-circuit current, an anomaly is declared in the "command" layer 23 of the system.

However, in the "control" layer 22, the general strategy is to filter rare fault occurrences, which occurrences would not in any case be confirmed during diagnostic testing in a repair shop. In order to overcome the problem of a detection that is too sensitive, a confirmation mechanism can be implemented over several successive verifications. This mechanism may be based on an anomaly counter respectively associated with each of the anomalies being considered. This anomaly counter may for example be kept updated in the "application" layer 21 of the system, depending on information relating to the presence or to the absence of the anomaly which is fed back from the "hardware" layer 24, via the "control" layer 22 and "command" layer 23, when each of the verifications is carried out. Thus, the anomaly counter is incremented if a verification yields a positive result with respect to the presence of an anomaly, and can be decremented in the opposite case.

However, it may potentially happen that verifications do not enable the detection of an anomaly that is nevertheless actually present. Such situations comprise for example the following non-limiting cases:

impossibility of detection of a short-circuit in the configuration of the H-bridge at the time of the verification (for example if the short-circuit sought is in parallel with a switch which is in the closed state in said configuration);

insufficiency of the time available for the verification, with respect to the time needed to observe the abnormal rise in the current in the load allowing the detection of the short-circuit (in view of the frequency and the duty cycle of the setpoint signal, and/or owing potentially to the inductance of the short-circuit);

insufficiency of the short-circuit current (in view of the voltage of the battery, and/or owing potentially to the resistance of the short-circuit).

It is for this reason that the confirmation mechanism may furthermore generate validity information associated with the information on the absence of an anomaly, in order to discriminate a situation of real absence of an anomaly from a situation of non-detection of the anomaly having nevertheless an uncertainty with regard to the existence or the absence of this anomaly. Indeed, the fact that an anomaly was not able to be detected during a given verification does not necessarily indicate the absence of said anomaly.

Thus, when an information relating to the absence of an anomaly is fed back to the "control" layer 22, the anomaly counter is only decremented if, in addition, a validity bit is set. If the validity bit is not set, the counter is left in its current state (neither incremented, nor decremented).

The anomaly detection devices which operate according to the principle hereinabove are relatively slow as regards the validity bit. Indeed, the current anomaly detection devices carry out the current measurement inside of a time window with a fixed duration. In the absence of a short-circuit, this duration can be in the range between 30 and 55 µs. If a short-circuit is detected, the validity bit is set upon detection, which is very probably made in a time well below 30 µs. Given that the period during which the H-bridge remains in a given configuration depends on the duty cycle, and in view of the range of duty cycle to be covered (ideally from 10% to 90% of the period of the setpoint signal, and generally as a minimum from 20% to 80% of this range), it turns out that the use of an anomaly bit in the known devices is not satisfactory, in this example, for frequencies higher than 3.6 kHz. Beyond such a frequency, the detection of anomalies is not optimal, because the system is frequently in one of the above-mentioned cases, so much so that many consecutive verifications give rise to a situation of uncertainty resulting in the impossibility of taking into account the validity bit.

Under these conditions, the use of the validity bit for the management of the anomaly counter, as presented hereinabove, in fact degrades the performance of the anomaly detection. It is for this reason that, currently, the systems that have to operate at a frequency higher than around 3.6 kHz do not use the validity bit. Consequently, all the situations of uncertainty with regard to the existence or the absence of an anomaly are handled by the upfeed of the information relating to the non-detection of anomalies, without any other possible discrimination. This type of detection is likely to generate delays in the response provided to the "application" level 21 in the case of the presence of a real anomaly. In certain cases, the known devices do not allow the detection of the presence of an anomaly.

SUMMARY OF THE INVENTION

The invention provides a management of the validity information, for example in the form of a validity bit as presented in the introduction hereinabove, which provides a higher performance detection of the anomalies. The solution provided allows the same level of reliability in the detection of the anomalies to be conserved even when the H-bridge is controlled at frequencies higher than 3.6 kHz thanks, amongst other reasons, to a higher precision of the clock of the integrated circuit, an anticipation of the decision for short-circuit detection and the possibility of adjusting, at the applications level, the duration of the reference time window.

For this purpose, a first aspect of the invention provides a device for supplying power to an inductive load comprising:
  a switching structure comprising at least one power switch and designed to control a current in the load,
  means for detecting anomalies designed to generate information on detection or information on non-detection of an anomaly of the short-circuit type, in combination with information on validity of the information on anomaly non-detection which is unset by default,
a device in which the means for detecting anomalies comprise:
  means for measuring current designed to measure the current in the power switch within a detection time window during which the switching structure is held in a given configuration,
  means of comparison designed to compare the measured current with a short-circuit current threshold and with an intermediate current threshold lower than the short-circuit current threshold, and in which, the detection time window being composed of a reference time window following the activation of the power switch and also, where appropriate, of an auxiliary time window following a moment in time when the measured current exceeds the intermediate current threshold, the means of comparison are designed furthermore to:
  deliver the information on anomaly detection and set the validity information if the measured current reaches the short-circuit current threshold before the end of the reference time window,
  deliver the information on anomaly non-detection and set the validity information, if the measured current remains lower than the intermediate current threshold until the expiration of the reference time window,
  deliver the information on anomaly non-detection and set the validity information if the measured current becomes higher than the intermediate current threshold before the end of the reference time window, but remains lower than the short-circuit current threshold until the end of the detection time window,
  deliver the information on anomaly detection and set the validity information if the measured current becomes higher than the intermediate current threshold before the end of the reference time window, but becomes higher than the short-circuit current threshold before the end of the detection time window.

The reduction in the time window needed for the generation of the validity bit allows such a validity bit to be used even when the system is controlled at a frequency higher than 3.6 kHz. For this reason, the precision of the anomaly detection mechanism is increased since only the effective detection of an absence of anomaly can give rise to the decrementation of the anomaly counter.

According to embodiments of the device, all or part of the following features may be provided:
  the device can furthermore comprise serial communication means, designed to allow the device to communicate with a control unit external to the device,
  the device can be designed to transmit the anomaly information and the validity information to the "control" layer via the serial communication means,
  the device can furthermore comprise first programmable storage means, designed to store modifiable values of the current thresholds,
  the first programmable storage means can be programmable by the "control" layer via the serial communication means,
  the device can furthermore comprise second programmable storage means, designed to store a modifiable value of the duration of the reference time window, and a modifiable value of the duration of the auxiliary time window,
  the second programmable storage means can be programmable by the "control" layer via the serial communication means, and
  the switching structure can comprise at least one power switch and can be designed to control the current in the load as a function of at least one control signal for the power switch, which is pulse-width modulated. In this case, the means for detecting anomalies can be designed to operate by forcing the duty cycle to 100%.

A second aspect of the invention relates to a method for supplying power to an inductive load by means of a device comprising:
  a switching structure comprising at least one power switch and designed to control a current in the load, and means for detecting anomalies designed to generate information on detection or information on non-detection of an anomaly of the short-circuit type in the cabling of the load, in combination with information on validity of the information on non-detection of anomalies which is unset by default, the method comprising:

the measurement of the current in the power switch within a detection time window during which the switching structure is held in a given configuration in which the power switch is closed, and the comparison of the measured current with a short-circuit current threshold and with an intermediate current threshold lower than the short-circuit current threshold, the detection time window being composed of a reference time window following the closure of the power switch and also, where necessary, of an auxiliary time window following a moment in time when the measured current exceeds the intermediate current threshold, the method furthermore comprises:

the delivery of the information on anomaly detection and the setting of the validity information if the measured current reaches the short-circuit current threshold before the end of the reference time window, the delivery of the information on anomaly non-detection and the setting of the validity information, if the measured current remains lower than the intermediate current threshold until the expiration of the reference time window, the delivery of the information on anomaly non-detection and the setting of the validity information if the measured current becomes higher than the intermediate current threshold before the end of the reference time window, but remains lower than the short-circuit current threshold until the end of the detection time window, and the delivery of the information on anomaly detection and the setting of the validity information if the measured current becomes higher than the intermediate current threshold before the end of the reference time window, but becomes higher than the short-circuit current threshold before the end of the detection time window.

BRIEF DESCRIPTION OF THE DRAWINGS

Other features and advantages of the invention will become more apparent upon reading the description that follows. The latter is purely illustrative and must be read with regard to the appended drawings in which:

FIGS. 6*a*, 6*b*, 6*c*, 6*d*, 6*e*, 6*f* show graphs of the current during a slightly inductive short-circuit as a function of time during a verification of the presence (or of the absence) of a short-circuit.

DETAILED DESCRIPTION OF THE INVENTION

Embodiments are described hereinafter in one exemplary application to an integrated circuit for controlling the direction and/or the intensity of the electrical current in an inductive load such as an electric motor used in an automobile.

Figure 1:
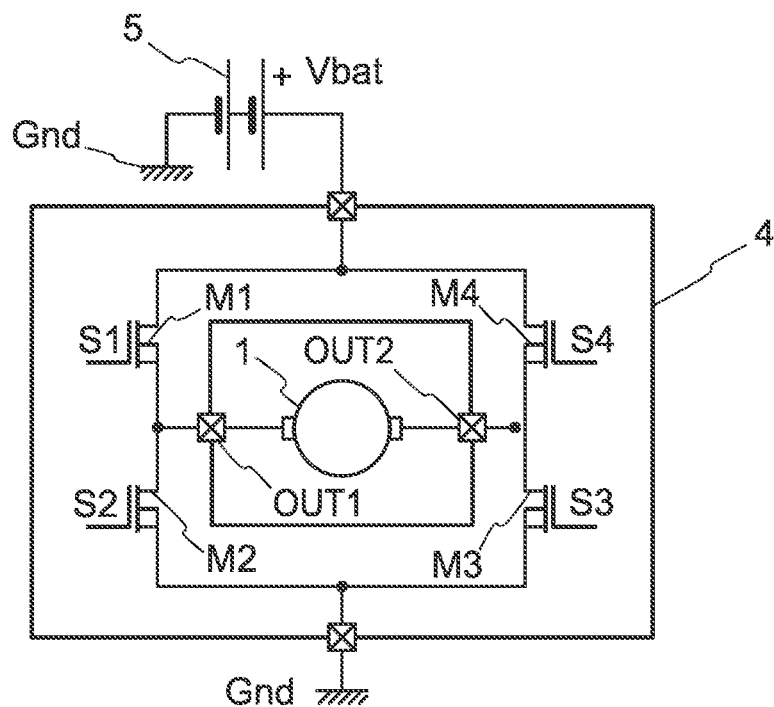
FIG. 1 is a schematic circuit diagram of one example of a switching structure comprising an H-bridge, FIG. 2, already described in the introduction, illustrates one example of functional decomposition of a system for supplying power to an inductive load, according to a layered architecture.

As shown schematically in FIG. 1, an H-bridge comprises four power switches, namely two "high" switches on the positive side of a power supply, for example the battery 5 of the vehicle producing a positive power supply voltage Vbat, and two "low" switches on the negative side of a power supply or ground Gnd of the vehicle.

Such a switching structure comprises four switches, each having, for example, a MOS power transistor. A first transistor M1 is connected between a positive power supply terminal to which, for example, the voltage of the battery Vbat is applied, and a first node OUT1. A second transistor M2 is connected between said node OUT1 and a ground terminal Gnd. A third transistor M3 is connected between a second node OUT2 and the ground terminal Gnd. Finally, a fourth transistor M4 is connected between the positive power supply terminal Vbat and said second node OUT2. The transistors M1 and M4 are referred to as "high side" transistors and the transistors M2 and M3 are referred to as "low side" transistors.

The node OUT1, between the first high transistor M1 and the first low transistor M2 which are in series between Vbat and Gnd, corresponds to a first output of the H-bridge. Similarly, the node OUT2, between a second high transistor M4 and a second low transistor M3 in series between Vbat and Gnd, corresponds to a second output of the H-bridge.

The inductive load, for example an electric motor 1 in the example shown in FIG. 1, is connected between the outputs OUT1 and OUT2 of the H-bridge.

Figure 2:
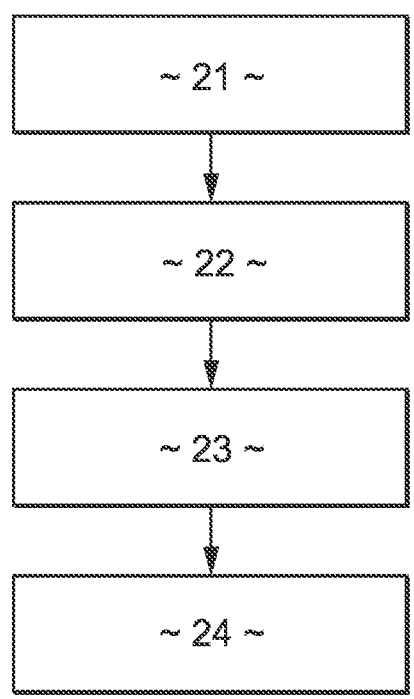

A sequence of analog signals S1 to S4 for controlling the four transistors M1 to M4, respectively, is produced from a setpoint control signal. The latter is generated within a "control" layer 22 of the system, coming above a "command" layer 23 which in turn is above a "hardware" layer 24 formed by electronic elements of the H-bridge per se. This sequence is produced according to a given control strategy, depending on the application. FIG. 2 shows the various layers breaking down the power supply system according to a given hierarchy, according to one exemplary embodiment. The elements and functionalities of the system are implemented in the form of hardware and/or software.

The control strategy causes the control of the H-bridge in certain given configurations. Other configurations are, on the contrary, prohibited, such as for example a configuration where the switches M1 and M2 are closed together, and this is in order to avoid the battery 5 being connected to ground Gnd.

Typically, the H-bridge can be controlled according to three possible states or configurations, described hereinbelow with reference to FIGS. 3*a*, 3*b* and 3*c*.

Figure 3A:
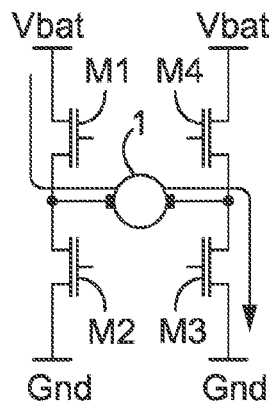
FIGS. 3*a*, 3*b*, 3*c* are diagrams illustrating various configurations for controlling an inductive load by pulse-width modulation by means of the H-bridge of FIG. 1, FIGS. 4*a* and 4*b* are graphs showing a periodic pulse-width modulated setpoint control signal, and the corresponding time variation of the current in the controlled inductive load.

In a first state, the pair formed by the high transistor M1 and the low transistor M3 allows, when these transistors are conducting (switches closed), a current to be made to flow through the electric motor 1 in a first direction, from Vbat to Gnd, as indicated by an arrow in FIG. 3a. The transistors M2 and M4 are then turned off (switches open).

Figure 3B:
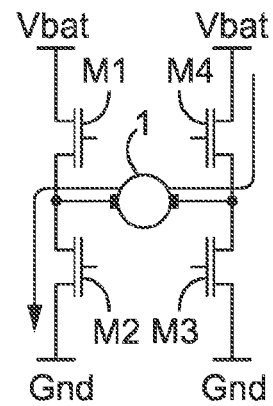

Conversely, in a second state, the pair formed from the low transistor M2 and the high transistor M4 allows, when these transistors are conducting (switches closed), a current to be made to flow through the motor 1 in the other direction, again from Vbat to Gnd, as indicated by the arrow in FIG. 3b. The transistors M1 and M3 are then turned off (switches open).

Figure 3C:
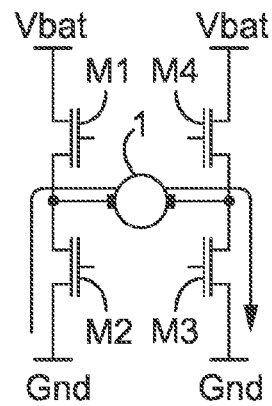

Lastly, in a third state illustrated in FIG. 3c, the high transistors M1 and M4 are turned off (switches open) and the low transistors M2 and M3 are conducting (switches closed). This allows the energy accumulated in the inductive load to be evacuated, in the form of a current flowing to ground Gnd through the low transistors M2 and M3, as shown by the arrow in FIG. 3c. This state is said to be a "freewheeling" state. It can be controlled consecutively to an operation of the H-bridge in the aforementioned first state or the second state, after the opening of the high transistor M1 or of the high transistor M4, respectively.

It should be noted that the freewheeling state described hereinabove and shown in FIG. 3c may also be achieved by other means. For example, when the high transistors M1 and M4 are conducting and the low transistors M2 and M3 are open. It is also possible to use structure diodes, allowing only one conducting transistor to be used, or even none. Depending on the strategy for controlling the transistors of the H-bridge, the decrease in the current during the freewheeling can differ.

It will be appreciated that the invention is not limited by the type of switching structure. Notably, it is also applicable to a half-bridge switching structure, in other words with two MOS power transistors only, or to a switching structure with only one power switch. Also, the embodiment of the power switch or switches shown in FIGS. 3a, 3b, 3c is only one non-limiting example. These switches can each comprise another type of transistor: a FET, Field-Effect Transistor; a BJT, Bipolar Junction transistor; an iGBT, Insulated Gate Bipolar Transistor; etc., instead of a MOS transistor. They may also comprise an assembly of such transistors, potentially with other components such as resistors, capacitors, etc.

A cabling referred to as "application cabling" connecting the H-bridge to the load can be used thus allowing the latter to be controlled. Physical anomalies may occur in the application cabling, in particular short-circuits at the outputs OUT1 and OUT2, notably:
- between the output OUT1 of the H-bridge and ground Gnd,
- between the output OUT1 of the H-bridge and the battery 5,
- between the output OUT2 of the H-bridge and ground Gnd,
- between the output OUT2 of the H-bridge and the battery 5, and
- between the output OUT1 and the output OUT2 of the H-bridge.

They can be detected by virtue of a measurement of the current in the transistors, in the form of an abnormal rise in the current in certain configurations of the H-bridge.

These short-circuits have a certain impedance (resistance and inductance). They are likely to affect the correct operation of the H-bridge, and hence of the system comprising the controlled load.

A detection of the anomalies of the short-circuit type is implemented so that an appropriate response may be provided, for example in the "application" layer 21 of the system coming above the "control" layer 22. This appropriate response may for example form a part of the diagnostic functionalities of the automobile vehicle.

In order for the system not to be subjected to too large a number of false alarms by excessive sensitivity (for example to intermittent and rare short-circuits, or to electromagnetic interference of the detection circuit), a return of information relating to a certain number of anomalies being considered may use a confirmation mechanism over several consecutive verifications. This mechanism is based on an anomaly counter associated with each anomaly in question. One anomaly counter per anomaly to be monitored can be provided.

This anomaly counter can for example be kept updated in the "command" layer 23 of the system, depending on information relating to the detection or to the non-detection of the anomaly which is returned from the "hardware" layer 24 when each of the verifications are carried out.

In some embodiments, this mechanism implements a "validity bit" in order to discriminate an absence of anomaly duly verified from a situation of uncertainty with regard to the existence or otherwise of an anomaly which may result from an impossibility of verification, such as in the case presented in the introduction.

Figure 4A:
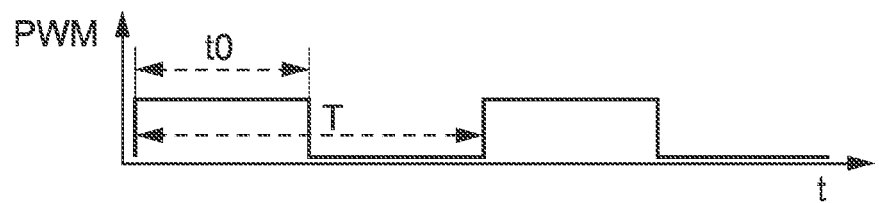
Figure 4B:
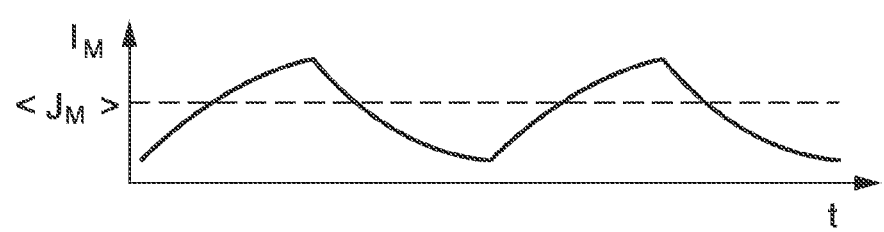

With reference to the timing diagrams in FIGS. 4a and 4b, the control of the current in the electric motor 1 is effected by pulse-width modulation of a periodic setpoint signal PWM. This signal has a given setpoint duty cycle and is used for generating control signals for the transistors of the transistor bridge.

The setpoint signal has a frequency which can reach 10 kHz, which gives a period T of around 100 µs.

As shown in FIG. 4a, such a setpoint signal PWM is, at each period T, in a given first logic state from between the high and low logic states for at least a first fraction of the period T, and in the other logic state for the remainder of the period T. In the example shown in FIG. 4a, the setpoint signal PWM is in the high logic state (active state) for a fraction of the period T having a duration $t_0$ less than the period T, called duration of activation. The setpoint duty cycle $d_{com}$ is given by:

$$d_{com} = t_0/T \tag{1}$$

The setpoint duty cycle $d_{com}$ can vary between 0% and 100%. It is acceptable for the detection of short-circuits to only be fully operational between 20% and 80%, but it is preferable for this to be between 10% and 90%.

FIG. 4b shows the time variation of the instantaneous value of the current $I_M$ in the electric motor 1 obtained in response to the setpoint control signal PWM in FIG. 4a.

Over the duration of activation of the setpoint signal PWM, in other words, in the example, when this signal is in the high logic state, the current $I_M$ in the electric motor 1 is increasing toward a given nominal value. This nominal value corresponds to the ratio between the positive power supply voltage divided by the value of a total resistance. The H-bridge is then controlled in the first or the second state, illustrated by FIGS. 3a and 3b, respectively, depending on the desired direction of rotation of the electric motor 1.

During the de-activation period of the setpoint signal PWM, in other words, in the example, when this signal is in the low logic state, the current $I_M$ is decreasing towards the zero value. The H-bridge is then controlled in the third state, or freewheeling state, illustrated by FIG. 3c.

Owing to the inductive nature of the load formed by the electric motor 1, the rises and falls of the current $I_M$ have gentle slopes, instead of following the profiles of the square edges of the setpoint signal PWM.

The mean value $<I_M>$ of the current $I_M$ is given by:

$$<I_M>=d_{com} \times V_{bat} \times 1/R \quad (2)$$

where R is essentially the value of the impedance of the electric motor 1. The other resistive elements are the values of the resistances in the conducting state of the transistors named RDSON, and the resistance of the wires, of the connections, and of the integrated circuit tracks.

As has been presented in the introduction, the verifications of anomalies are carried out in the "command" layer 23 of the system, in other words for example by measuring the real current in the MOS power transistors of the H-bridge, in certain configurations of the latter.

When an anomaly is detected, the corresponding information is sent to the "application" layer 21 of the system. When information indicating an anomaly is returned to this layer, the anomaly counter which is managed at this level is incremented. When, conversely, no anomaly is detected, the corresponding information is sent to the microcontroller, and the validity bit then indicates whether the absence of detection of an anomaly corresponds to an effective absence of anomaly (in which case, for example, the validity bit is set, i.e., is set at the logic state 1) or only to the fact that a verification of anomaly was not able to be carried out or that the detection of a potential anomaly cannot be be guaranteed (in which case, the validity bit is not set, i.e. Is left at the logic state 0 in the example, under the assumption that it has been reset to 0 at the startup of the system).

When the anomaly counter exceeds a certain threshold, confirming over a succession of verifications the effective presence of the anomaly in the H-bridge, corresponding information is generated in the "application" layer 21. The sensitivity (in other words the maximum admissible number) is fixed in this level.

It will be noted that several counters of anomalies may be run in parallel in the "application" layer 21, for example one for each type of anomaly and/or one for each anomaly that may be considered.

Figure 5:
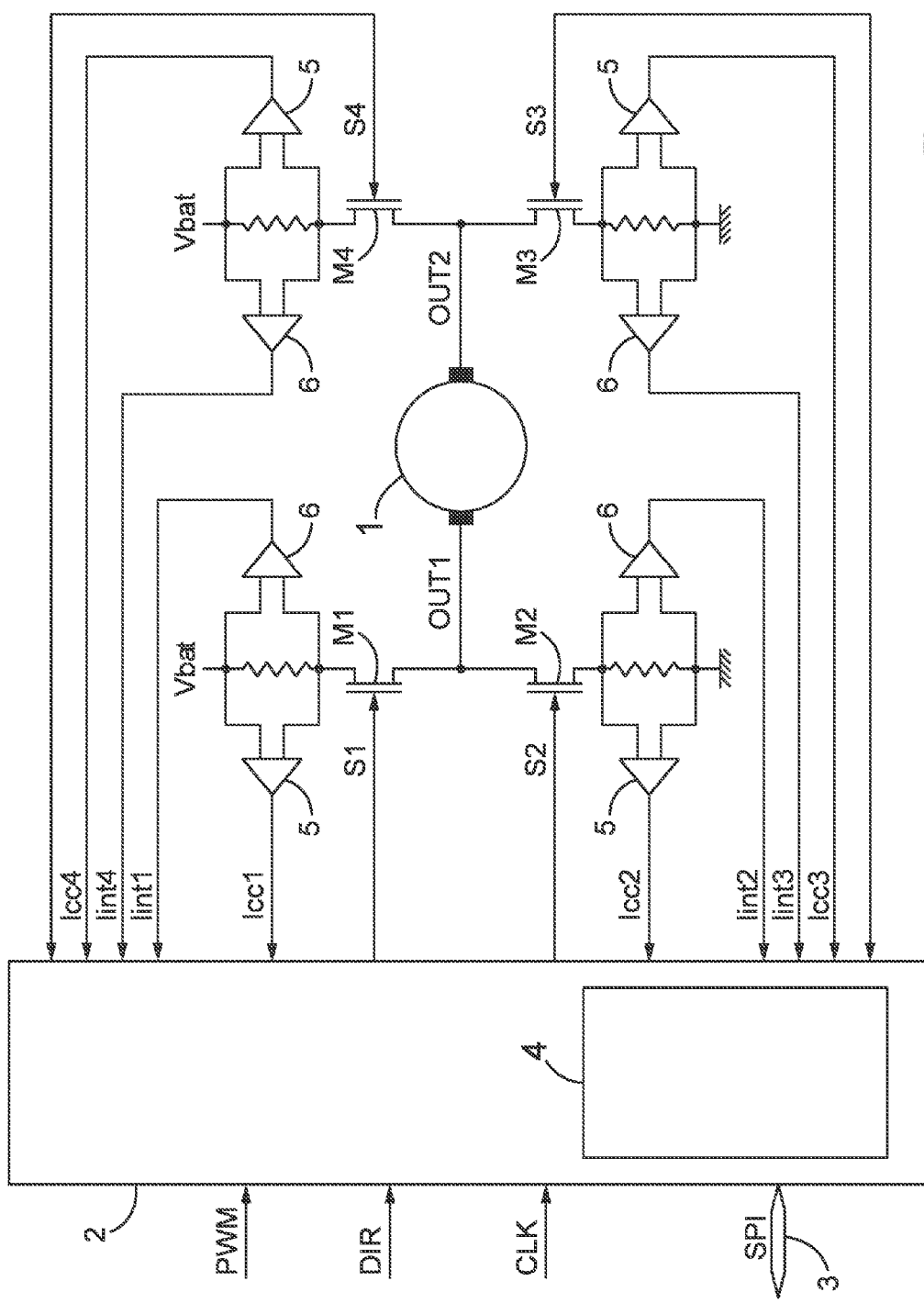
FIG. 5 is a schematic circuit diagram of one example of a control device according to some embodiments.

One embodiment of a control device is presented schematically in FIG. 5. Its operation will be explained hereinbelow with reference to the graphs in FIGS. 6a, 6b, 6c, 6d and 6f. These graphs give the current measured in a transistor (M1, M2, M3 or M4) as a function of time, when the H-bridge is in a normal configuration, for example from amongst those in FIGS. 3a and 3b, or in the configuration of a short-circuit.

With reference to FIG. 5, the device 4 can be implemented in the form of an integrated circuit, for example an ASIC (Application Specific Integrated Circuit), or similar form. It can be coupled to a control unit 2, for example a microcontroller, a microprocessor, or similar device, which is for example external to the device per se. However, in the vast majority of cases, the logic and control unit 2 is internal. It is for example formed within the logic of the integrated circuit comprising the MOS power transistor, which is in this case more commonly referred to as a "smart power" circuit which denotes its function as an intelligent power circuit. The logic and control unit 2 may also be an independent integrated circuit, the controlled MOS power transistors then taking the form of separate components.

The functionalities of the logic and control unit 2 correspond to a "command" layer 23 of the system, if a layered model is considered, such as that to which reference has already been made hereinabove for the modeling of the system.

The logic and control unit 2 receives control signals DIR and PWM as input. It delivers as output control signals S1, S2, S3 and S4 for the MOS transistors of the H-bridge supplying power to the electric motor 1, namely the transistors M1, M2, M3 and M4, respectively.

At the input of the logic and control unit 2, the signal DIR is for example a binary logic signal that controls the direction of rotation of the motor, in other words the direction of flow of the current through the H-bridge (see FIGS. 3a and 3b). The signal PWM is the setpoint control signal, with the setpoint duty cycle $d_{com}$, which determines the quantity of current powering the load allowing for example the speed and/or the torque of the electric motor 1 to be controlled. The signals DIR and PWM originate for example from the motor control computer, i.e., from the "application" layer 21 of the system, relayed via the "control" layer 22. The signal PWM has for example a frequency of around 10 kHz, which gives a period of around 100 µs.

The logic and control unit 2 furthermore receives first signals Icc1, Icc2, Icc3, Icc4, on the one hand, and second signals Iint1, Iint2, Iint3, Iint4, on the other. The first are representative of the detection or of the non-detection of a potential short-circuit in the MOS transistors M1, M2, M3, M4, respectively. The second are representative of the exceeding of the intermediate current threshold by the measured current. Each of these first and second signals is for example a binary signal, i.e., one bit of information which can take the logic value 1 or 0 for indicating the detection or the non-detection, respectively, of a short-circuit or of a current exceeding the intermediate current threshold. These bits cause, under certain conditions which will be described hereinbelow, the counting up/down of a contradictions counter managed in the logic and control unit 2. The value of this counter, named for example err_count, allows the number of times to be counted where a short-circuit is not detected at the end of the reference or detection time window, and subsequently being detected outside of these time windows.

The means of comparison of the currents flowing in the four MOS power transistors are represented by voltage comparators whose differential inputs are on either side of a low-value resistance associated with each transistor. Such a circuit would be capable of performing the function sought, and the current threshold would depend on the value of hysteresis fixed in the voltage comparator. In an integrated circuit, it is preferred to use current mirrors together with current comparators for effecting the same functionalities. However, the representation would be a little more complex than what has been chosen in FIG. 5.

Irrespective of the technological implementation, the first signals Icc1, Icc2, Icc3 and Icc4 are designed to take logic values 0 or 1 as a function of the values of the current flowing in the MOS transistors. In one example, the signals Icc1, Icc2, Icc3 and Icc4 take the logic value 1 if the current flowing in the transistor in question (respectively M1, M2, M3 or M4) is higher than a threshold I_oc, in other words a current corresponding to a short-circuit.

In addition, irrespective of the technological implementation, the second signals Iint1, Iint2, Iint3 and Iint4 are designed to take logic values 0 or 1 as a function of the values of the current flowing in the MOS transistors. For example, the signals Iint1, Iint2, Iint3 and Iint4 take the logic value 1 if the current flowing in the transistor in question (respectively M1, M2, M3 or M4) is higher than a threshold I_int, in other words a high current but substantially lower than a threshold I_oc.

It is of course possible to use an inverse logic for the first signals and/or for the second signals (such that the logic value 0 would be the result of a current higher than the threshold). In another exemplary embodiment of the invention, the intermediate current threshold I_int can be modifiable as can the short-circuit current threshold I_oc. Since the two thresholds I_int and I_oc are linked, it is preferable, in order to simplify the use of such a system, for the selection of one (intermediate current threshold) to lead to the automatic selection of the other (short-circuit current threshold). The choice of the current thresholds comes from the "application" layer 21, and the information is relayed via the "control" layer 22 to the "command" layer 23, which configures the "hardware" layer 24, for example in an initialization or reset phase.

The means of communication 3 may comprise a serial bus, for example a SPI (Serial Peripheral Interface) bus. As a variant, they could comprise a serial interface of the I$^2$C type, for example.

If the current in a MOS power transistor does not reach the intermediate current threshold I_int during the reference time window, the logic and control unit 2 sets information on non-detection together with the validity bit. If in the following part of the same measurement, the short-circuit current threshold I_oc is exceeded in this transistor, the diagnostic is changed and the contradiction counter err_count takes account of the event. In all the cases where the current in a transistor exceeds the threshold I_oc, there can be a provision for the logic and control unit 2 to immediately stop the activation of the transistors, in order to avoid their destruction.

The description of the control strategy and of the response strategy implemented in the "application" layer 21 would go outside of the scope of the present description. The invention indeed relates to the management of the validity bit which is associated with the information on absence of an anomaly within the "hardware" layer 24. It aims to provide the generation of the validity bit in an optimized manner, in order that this validity bit can be taken into account in the management of the value of the anomaly counter, even when the control frequency of the H-bridge is as high as 10 kHz, for example.

The device also comprises a set of registers 4 which store a value T_diag1 corresponding to the duration of a time window referred to as reference time window, and the duration T_diag2 of an auxiliary time window, which will be further discussed hereinbelow. For example, these durations may be expressed as a number of periods of the clock signal CLK. In one embodiment, the intermediate time window T_diag1 has a modifiable duration, the corresponding register from the set of registers 4 being programmable for this purpose, for example under the control of the logic and control unit 2 via the communications bus 3. This allows the operation of the device to be adapted to the specific needs of the application. The period T_diag2 can be fixed. In one embodiment, however, the period T_diag2 is modifiable, as indicated hereinabove for the period T_diag1.

In some embodiments, the current comparators and the registers 4 can be formed on the same chip of semiconductor material as the H-bridge, for example in the ASIC circuit.

The operation of the device will now be detailed with reference furthermore to FIGS. 6a, 6b, 6c, 6d, 6e and 6f. It is assumed that the H-bridge is controlled via the signals S1-S4 in a configuration allowing the measurement of the current flowing in the transistors.

For each transistor, the management of the diagnostic is illustrated by FIGS. 6a to 6f, according to various cases that can arise.

Generally speaking, the variation of the current and, more particularly, the rise of the current takes place relatively slowly because the latter is flowing through an inductive load. The inductive load behaves, at the time when a transistor starts to conduct, as a current source, which absorbs its current either through the transistor in question, or through other paths (going from ground or the battery, through the structure diodes). Hence, during the control of the electric motor 1, for a transistor participating in the current path, the current through this transistor very quickly reaches a value close to the value of current corresponding to the end of the intermediate time window Tdiag1.

This value of current, during a normal operation, is expected to be much lower than the intermediate value I_int. On the other hand, during a case of permanent short-circuit, there is a sharp rise in current over a much larger amplitude through a transistor concerned by the short-circuit. Unless the battery voltage is low and there is a relatively very resistive short-circuit, this current increases for the whole duration of activation of the transistor. If this duration is sufficiently long, for example 30 μs, the short-circuit threshold will be reached. As the detection of the short-circuit therefore happens in a shorter time, for example 15 μs, the comparison is made at the end of this time, called Tdiag1, to be counted from the activation of the transistor in question. The main idea is therefore to discriminate a case where the current is lower than I_int at the end of Tdiag1, from the other cases some of which are cases of short-circuits.

Some of the cases, where at the end of the period Tdiag1 the current is greater than I_int, require an additional time to recognize a short-circuit, which is the reason for the use of another period Tdiag2 which can extend Tdiag1. These cases are not frequent. They are nevertheless the subject of a description hereinbelow, with regard to FIGS. 6c to 6f.

In FIG. 6a, two normal cases with no short-circuit are shown. For one of the cases, case A, the transistor does not participate in the free-wheeling process, thus, when it is activated, the current in the inductive load remains practically constant while the switching of the current in the transistor takes place progressively in a few microseconds, for example 3 microseconds. For the other case (case B shown in dashed lines), the transistor was activated during the free-wheeling and does not see any abrupt transient current through it. In the two cases, at the time t1, in other words when the period Tdiag1 has passed, the value of current reached I1 is less than the value I_int. This allows it to be recorded that there is no short-circuit and the validity bit to be set to 1. It is the logic and control unit 2 which establishes the diagnostic for each of the four transistors according to this principle.

Figure 6B:
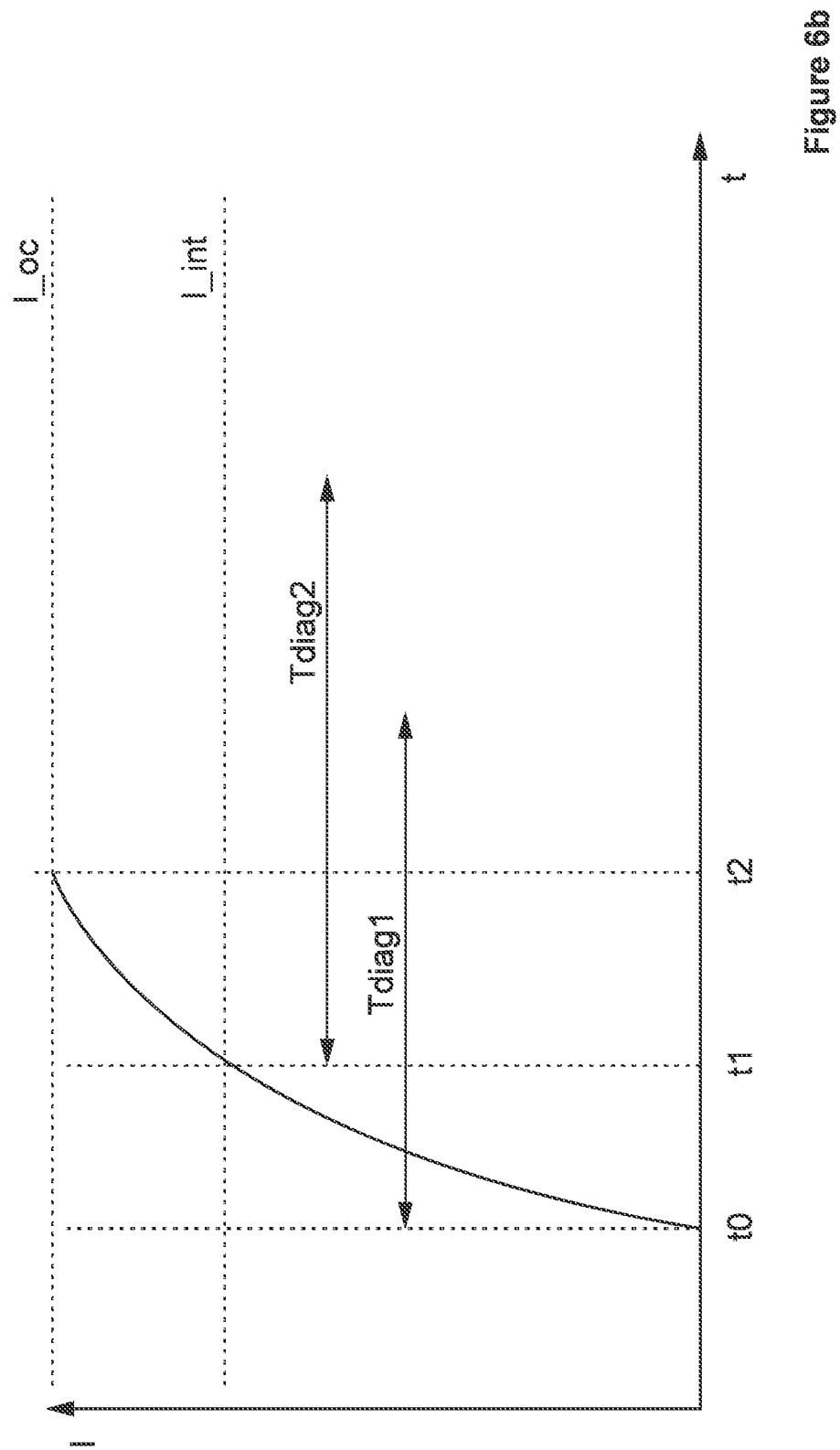

In FIG. 6b, a case of short-circuit is shown. The current increases rapidly and reaches the threshold I_oc at the time t2, before the expiration of the period Tdiag1. At the time t1, when the current reaches the threshold I_int, the counting of the period Tdiag2 is started, but it is not useful in this case. The logic and control unit 2 records that there is a short-circuit and sets the validity bit at 1 for the transistor in question.

In FIG. 6c, a case of relatively resistive short-circuit is shown. This short-circuit would not be detected by a conventional circuit not using the invention. This is why the anticipated decision should ideally be the same, in other words a non-detection. The current increases rapidly to reach the threshold I_int, at the time t1, while the period Tdiag1 has not expired. It is not possible at this stage to predict that the threshold I_oc will be crossed. Starting from the time t1, a complementary period Tdiag2 is started and expires at a later time t2. At the time t2, the current reaches the value I2 which is less than I_oc. As a consequence, the logic and control unit 2 records that there is no short-circuit and sets the validity bit at 1 for the transistor in question.

Figure 6D:
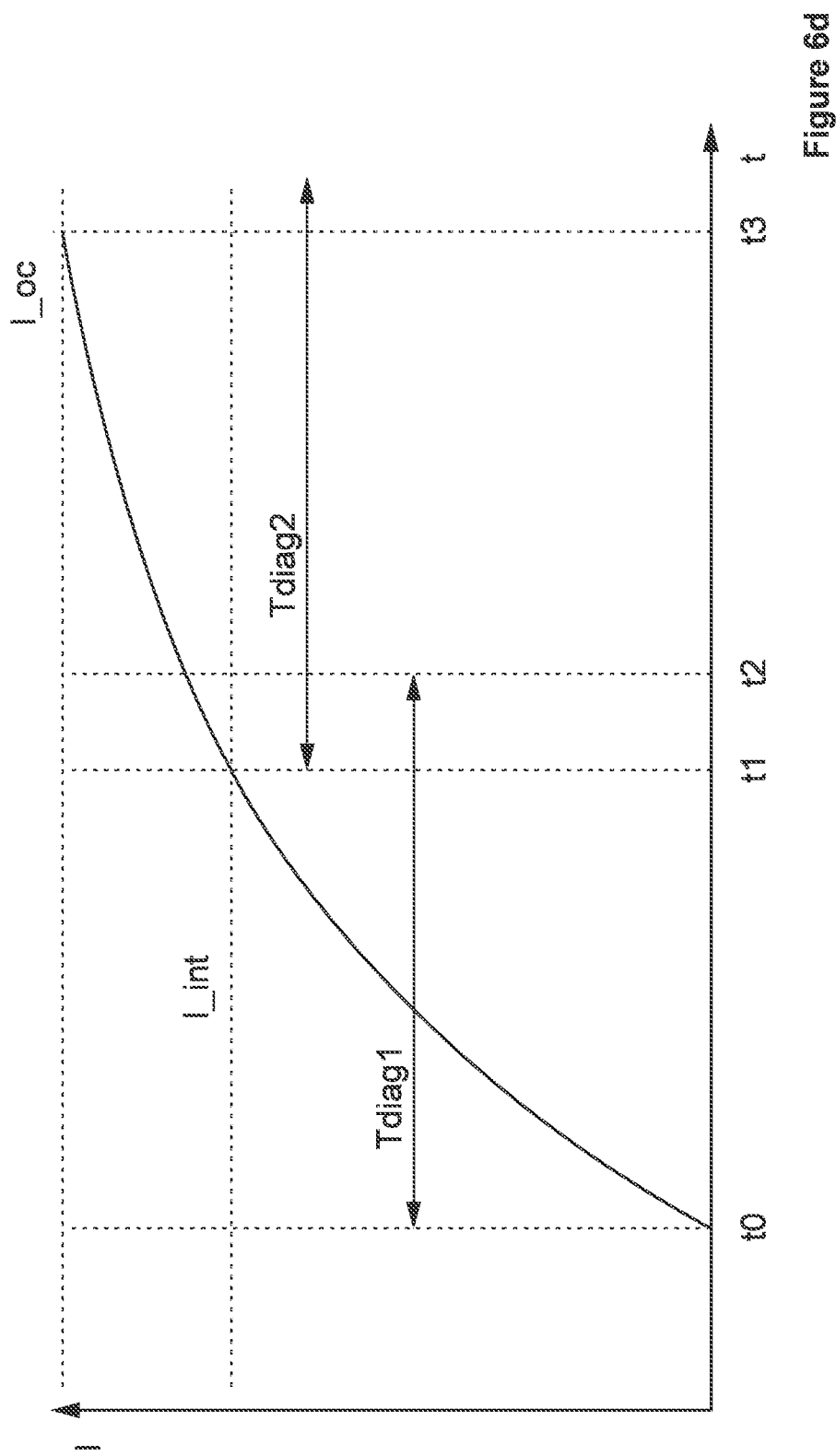

In FIG. 6d, a case of relatively resistive short-circuit is shown. The current reaches the short-circuit threshold after a relatively long period of time. During the period Tdiag1, the current does not reach the threshold I_oc but reaches the threshold I_int at the time t1. It is not possible to foresee at the time t1 whether the threshold I_oc will be reached or not. The counting of the complementary period Tdiag2 is started at the time t1. The current reaches the threshold I_oc at the time t3, before the period Tdiag2 expires. At this time t3, the logic and control unit 2 records that a short-circuit is detected and sets the validity bit at 1 for the transistor in question.

Figure 6E:
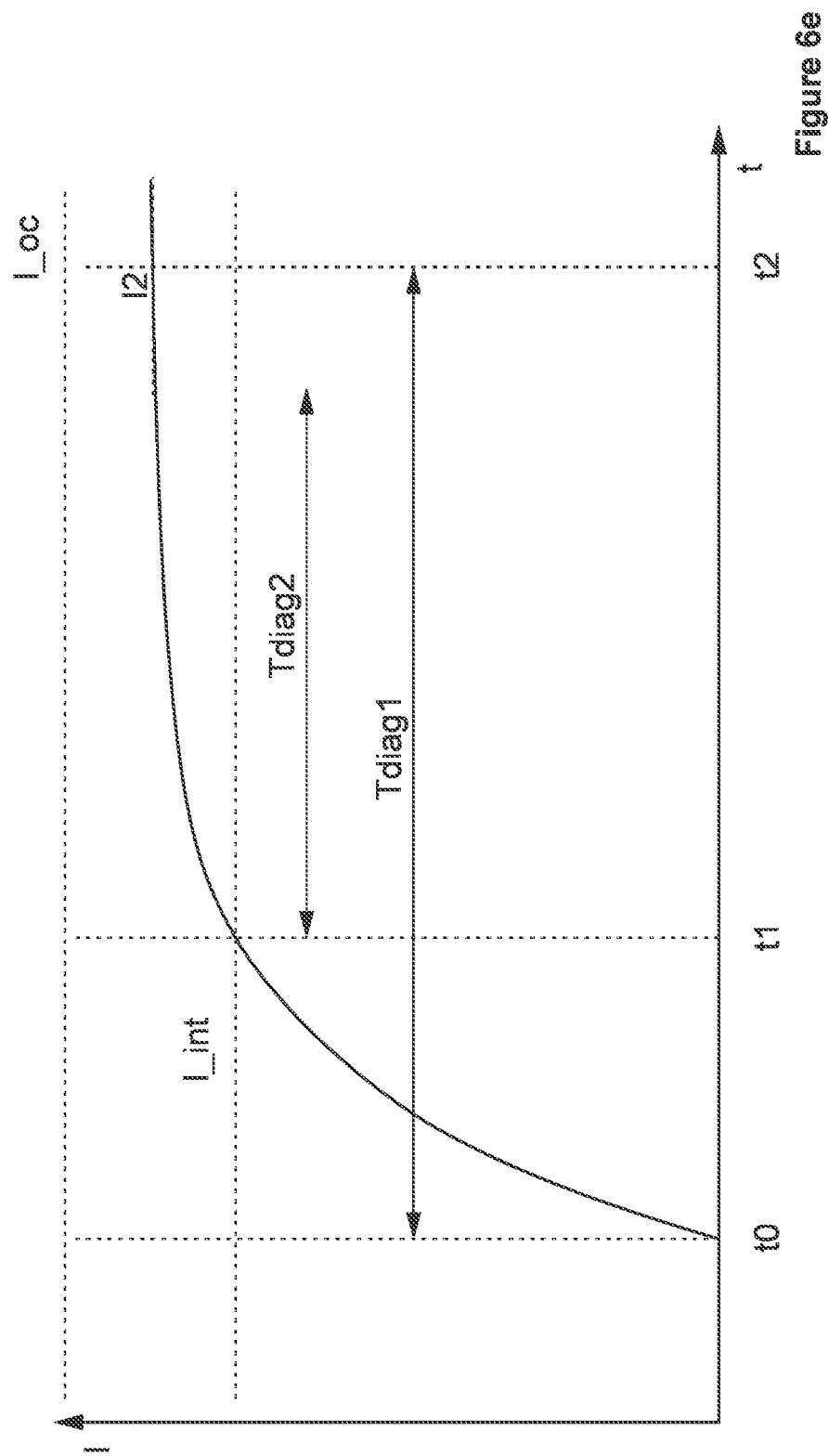

In FIG. 6e, a case of relatively resistive short-circuit is shown. This short-circuit would not be detected by a conventional circuit not using the invention. This is why the anticipated decision should ideally be the same, namely a decision of non-detection. At the time t1, the current reaches the threshold I_int, and as a consequence, the counting of the complementary period Tdiag2 is started. However, this counting turns out to be pointless since it expires before the end of Tdiag1, which occurs at the time t2. In the case shown, the current reaches the value I2, lower than threshold I_oc, at the time t2. The logic and control unit 2 records that there is no short-circuit and sets the validity bit at 1 for the transistor in question.

In FIG. 6f, a case of relatively resistive short-circuit is shown. The current reaches the short-circuit threshold after a relatively long period of time. During the counting of the period Tdiag1, the current reaches the threshold I_int at the time t1. It is not possible to foresee at the time t1 whether the threshold I_oc will be reached or not before the end of the measurement. The counting of the complementary period Tdiag2 is started at the time t1. This counting turns out to be pointless because its expiration happens prior to that of the counting of the period Tdiag1. In the case shown, the current reaches the threshold I_oc before the expiration of the period Tdiag1. The logic and control unit 2 records that there is a short-circuit and sets the validity bit at 1 for the transistor in question.

The principle of operation of the method and of the device for its implementation according to some embodiments of the invention is illustrated in detail hereinafter.

For each of the transistors, after a transition of the configuration from a free-wheeling one to an activation configuration, or vice versa, the counting of the period Tdiag1 is started. If the current does not reach the threshold I_int before the expiration of this count, then the validity bit is set to 1 and it is considered there is no short-circuit. The sequence may be cut short during the operation when a new transition takes place.

If the current reaches the threshold I_int prior to the expiration of Tdiag1, then the counting of the time period Tdiag2 is activated. If the current reaches the threshold I_oc before the expiration of Tdiag1 or of Tdiag2, then the validity bit is set to 1 and the short-circuit is taken into account. In the opposite case, when the threshold I_oc has not been reached either at the expiration of Tdiag1, or at the expiration of Tdiag2, then the validity bit is set to 1 and it is considered there is no short-circuit. Beyond the expiration of Tdiag1 and Tdiag2, when no short-circuit is detected, a new transition returns the operation to the beginning of the method according to the invention.

In some embodiments, a test is furthermore provided that enables the periodic verification of the coherence of the process of detection of the potential anomalies. The test can consist in forcing the duty cycle $d_{com}$ of the control signal PWM to 100% and 0% for several periods of this signal during which an anomaly verification is carried out.

The aim and purpose of this modification is to test the coherence of the results of the verifications of the presence of an anomaly previously carried out. Indeed, by forcing the duty cycle to 100% and 0%, it is ensured that the maximum possible current is controlled in the transistors. Also, the maximum possible time (at the frequency of the signal PWM in question) is available for measuring it. Thus, if a short-circuit exists, it has more chance of being detected.

In other words, the function of this follow-up test is to verify that the absence of short-circuit detection is valid, or if, on the contrary, a short-circuit may exist without it having been detected.

If the absence of detection of a short-circuit is not confirmed by this test, i.e., if a short-circuit is detected during the test with d=100% or 0% whereas it had not been detected before, then a modification of the verification parameters can be applied. For example, the duration of the intermediate time window T_diag1 may be modified.

The description hereinabove has been presented by way of illustration only and does not limit the scope of the invention. Any variant embodiment that may be technically envisioned may be preferred to the embodiments described. For example, the error counter err_count can be implemented by means of an external circuit or of logic gates and associated circuitry allowing the same function as that described in the invention to be implemented.

Similarly, the values of the current thresholds and of the durations of reference, auxiliary and detection time windows are given by way of illustration and are not limited to the examples presented here and may take any other values according to the system of implementation.

Lastly, it will be clearly understood that the invention is applicable to the control of any inductive load, not only to that of an electric motor. It may, for example, be applied to an electromagnetic actuator with a fixed coil and mobile core (or vice versa).

The invention claimed is:

1. A device for supplying power to an inductive load, comprising:
   a switching structure with at least one power switch and designed to control a current in the load; and
   an apparatus for detecting anomalies, configured to generate information of either detection or non-detection of a short-circuit anomaly in cabling of the load, in combination with information on validity of the information on anomaly non-detection which is unset by default,
   wherein the apparatus for detecting anomalies comprises:
      current measuring circuits that measure a current in the power switch within a detection time window during which the switching structure is held in a given configuration in which the power switch is closed, and
      a comparison circuitry that compares the measured current with a short-circuit current threshold and with an intermediate current threshold lower than the short-circuit current threshold,
   wherein, the detection time window is composed of a reference time window following the closure of the power switch, and also composed of, when the measured current exceeds the intermediate current threshold, an auxiliary time window following a moment in time, and wherein the comparison circuitry is further configured to:
output the information on anomaly detection and set the validity information if the measured current reaches the short-circuit current threshold before an end of the reference time window,
output the information on anomaly non-detection and set the validity information, if the measured current remains lower than intermediate current threshold until the expiration of the reference time window,
output the information on anomaly non-detection and set the validity information if the measured current becomes higher than the intermediate current threshold before the end of the reference time window, but remains lower than the short-circuit current threshold until the end of the detection time window, and
output the information on anomaly detection and set the validity information if the measured current becomes higher than the intermediate current threshold before the end of the reference time window, but becomes higher than the short-circuit current threshold before the end of the detection time window.

2. The device as claimed in claim 1, further comprising:
a serial communication interface configured to communicate with a control unit external to the device.

3. The device as claimed in claim 2, wherein the information is transmitted upon detection of anomalies and the validity information is transmitted to the external control unit via the serial communication interface.

4. The device as claimed in claim 1, further comprising:
first programmable data storage having stored therein a modifiable value of the intermediate current threshold and a modifiable value of the short-circuit current threshold.

5. The device as claimed in claim 4, wherein the first programmable storage is programmable by the external control unit via the serial communication interface.

6. The device as claimed in claim 1, further comprising:
second programmable data storage having stored therein at least one of a modifiable value of the duration of the reference time window and a modifiable value of the duration of the auxiliary time window.

7. The device as claimed in claim 6, wherein the second programmable storage is programmable by the external control unit via the serial communication interface.

8. The device as claimed in claim 1,
wherein the switching structure controls the current in the load as a function of at least one control signal for the power switch which is pulse-width modulated, and
wherein the apparatus for detecting anomalies operates by forcing a duty cycle to 100%.

9. The device as claimed in claim 8, wherein the control signal for the power switch is received from the external control unit.

10. A method for supplying power to an inductive load using a switching structure that controls a current in the load and an apparatus that generates information of either detection or non detection of a short-circuit anomaly in the cabling of the load, and also generates information on validity of the information on non-detection of anomalies which is unset by default, the method comprising:
measuring current in the power switch within a detection time window during which the switching structure is held in a given configuration in which the power switch is closed;
comparing the measured current with a short-circuit current threshold and with an intermediate current threshold lower than the short-circuit current threshold,
the detection time window being composed of a reference time window following the closure of the power switch, and also composed of, when the measured current exceeds the intermediate current threshold, an auxiliary time window following a moment in time;
delivering the information on anomaly detection and the setting of the validity information if the measured current reaches the short-circuit current threshold before an end of the reference time window;
delivering the information on anomaly non-detection and the setting of the validity information, if the measured current remains lower than the intermediate current threshold until the expiration of the reference time window;
delivering the information on anomaly non-detection and the setting of the validity information if the measured current becomes higher than the intermediate current threshold before the end of the reference time window, but remains lower than the short-circuit current threshold until the end of the detection time window; and
delivering the information on anomaly detection and the setting of the validity information if the measured current becomes higher than the intermediate current threshold before the end of the reference time window, but becomes higher than the short-circuit current threshold before the end of the detection time window.

11. The device as claimed in claim 2, further comprising:
first programmable data storage having stored therein a modifiable value of the intermediate current threshold and a modifiable value of the short-circuit current threshold.

12. The device as claimed in claim 3, further comprising:
first programmable data storage having stored therein a modifiable value of the intermediate current threshold and a modifiable value of the short-circuit current threshold.

13. The device as claimed in claim 2, further comprising:
second programmable data storage having stored therein at least one of a modifiable value of the duration of the reference time window and a modifiable value of the duration of the auxiliary time window.

\* \* \* \* \*